(12) United States Patent
Fachmann et al.

(10) Patent No.: US 9,812,373 B2
(45) Date of Patent: Nov. 7, 2017

(54) SEMICONDUCTOR PACKAGE WITH TOP SIDE COOLING HEAT SINK THERMAL PATHWAY

(71) Applicant: Infineon Technologies AG, Neubiberg (DE)

(72) Inventors: Christian Fachmann, Fürnitz (AT); Ralf Otremba, Kaufbeuren (DE); Klaus Schiess, Allensbach (DE); Franz Stueckler, St. Stefan (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/960,804

(22) Filed: Dec. 7, 2015

(65) Prior Publication Data
US 2016/0163616 A1    Jun. 9, 2016

(30) Foreign Application Priority Data

Dec. 8, 2014  (DE) ................ 10 2014 118 080

(51) Int. Cl.
| | |
|---|---|
| *H01L 23/367* | (2006.01) |
| *H01L 23/373* | (2006.01) |
| *F28F 21/08* | (2006.01) |
| *H01L 23/00* | (2006.01) |
| *H01L 23/495* | (2006.01) |

(52) U.S. Cl.
CPC ........ *H01L 23/3672* (2013.01); *F28F 21/081* (2013.01); *H01L 23/367* (2013.01); *H01L 23/3735* (2013.01); *H01L 23/3736* (2013.01); *H01L 23/3737* (2013.01); *H01L 24/00* (2013.01); *H01L 23/49551* (2013.01)

(58) Field of Classification Search
CPC ............ H01L 23/3672; H01L 23/3736; H01L 23/367; H01L 34/3735; H01L 34/3737; H01L 34/00
USPC ....... 257/692, 712, 713, 717, 721, 707, 710, 257/704, 706, 708, 782
See application file for complete search history.

(56) References Cited

U.S. PATENT DOCUMENTS

| | | |
|---|---|---|
| 6,677,669 B2 | 1/2004 | Standing |
| 2006/0022331 A1 | 2/2006 | Shinohara et al. |

(Continued)

FOREIGN PATENT DOCUMENTS

| | | |
|---|---|---|
| DE | 10149093 A1 | 8/2002 |
| DE | 102008046728 A1 | 5/2009 |
| DE | 112011104406 T5 | 9/2013 |

*Primary Examiner* — Alexander Oscar Williams
(74) *Attorney, Agent, or Firm* — Murphy, Bilak & Homiller, PLLC (57) ABSTRACT

An electronic module includes a semiconductor package including a semiconductor chip and an electrically insulating encapsulation body encapsulating the semiconductor chip, the encapsulation body completely covering a second main face and four side faces of the semiconductor chip, wherein a first main face of the semiconductor chip that is opposite the first main face is exposed from the encapsulation body, a heat spreader attached to the semiconductor package, the heat spreader completely covering the first main face of the semiconductor chip, and an electrically insulating layer disposed on the heat spreader remote from the semiconductor package. The electrically insulating layer is completely separated from the semiconductor chip.

15 Claims, 6 Drawing Sheets

(56) References Cited

U.S. PATENT DOCUMENTS

| | | | |
|---|---|---|---|
| 2007/0138651 A1* | 6/2007 | Hauenstein | H01L 23/13 257/782 |
| 2007/0278667 A1* | 12/2007 | Kusano | H01L 21/565 257/712 |
| 2008/0131655 A1* | 6/2008 | Wacker | F28F 13/185 428/119 |
| 2010/0276797 A1* | 11/2010 | Landau | H01L 23/3107 257/692 |
| 2012/0027928 A1 | 2/2012 | Otremba et al. | |
| 2012/0129300 A1* | 5/2012 | Lin | H01L 21/56 438/122 |
| 2012/0238042 A1* | 9/2012 | Ossimitz | G01R 1/0408 438/14 |
| 2013/0113120 A1 | 5/2013 | Tsuruoka et al. | |
| 2013/0240912 A1 | 9/2013 | Shiota et al. | |
| 2014/0103505 A1 | 4/2014 | Zhao et al. | |
| 2015/0062824 A1* | 3/2015 | Hyun | H01L 23/38 361/716 |

* cited by examiner

SEMICONDUCTOR PACKAGE WITH TOP SIDE COOLING HEAT SINK THERMAL PATHWAY

PRIORITY CLAIM

This application claims priority to German Patent Application No. 10 2014 118 080.1 filed on 8 Dec. 2014, the content of said application incorporated herein by reference in its entirety.

TECHNICAL FIELD

This application concerns a heat spreader, an electronic module comprising a heat spreader and a method of fabricating a heat spreader or an electronic module comprising a heat spreader.

BACKGROUND

During operation, an electronic module comprising a semiconductor chip may produce heat which may have to be dissipated through a designated thermal pathway. A thermal pathway may be directed towards a topside of the electronic module, wherein heat dissipation means like, for example, a heat sink may be arranged on the top side of the electronic module. It may be desirable to reduce a thermal resistance between the semiconductor chip and the heat dissipation means in order to improve a heat dissipation capability of the electronic module.

SUMMARY

An electronic module is disclosed. According to an embodiment, the electronic module includes a semiconductor package, a heat spreader attached to the semiconductor package, and an electrically insulating layer disposed on the heat spreader remote from the semiconductor package.

A heat spreader is disclosed. According to an embodiment, the heat spreader includes a metal sheet or metal plate, and an electrically insulating layer arranged over the metal sheet or metal plate.

The metal sheet or metal plate has a thickness in the range of 0.1 mm-1 mm. At least a part of a second main surface of the metal sheet or metal plate is not covered by the electrically insulating layer.

A method for fabricating an electronic module is disclosed. According to an embodiment, the method includes providing a semiconductor package, providing a heat spreader comprising a first main surface and a second main surface opposite the first main surface, providing an electrically insulating layer on the first main surface of the heat spreader, and coupling the heat spreader to the semiconductor package such that the second main surface of the heat spreader faces the semiconductor package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded," "attached," "connected," "coupled" and/or "electrically connected/electrically coupled" are not meant to mean that the elements or layers must directly be contacted together; intervening elements or layers may be provided between the "bonded," "attached," "connected," "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Devices or semiconductor packages containing semiconductor chips are described below. The semiconductor chips may be of different types, may be manufactured by different technologies and may include for example integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or microelectromechanical components. Further, they may be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements in particular on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the electronic modules described below may include integrated circuits to control the integrated circuits of other semiconductor chips, for example the integrated circuits of power semiconductor chips. The semiconductor chips can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The devices described below include external contact elements or external contact pads on the package. The external contact pads may represent the external terminals of the semiconductor package. They may be accessible from outside the package and may thus allow electrical contact to be made with the semiconductor chip(s) from outside the package. Furthermore, the external contact pads may be thermally conductive and may serve as heat sinks for dissipating at least part of the heat generated by the semiconductor chip or chips embedded in the semiconductor package. The external contact pads may be composed of any desired electrically conductive material, for example of a metal, such as copper, aluminum or gold, a metal alloy or an electrically conductive organic material. Solder material, such as solder balls or solder bumps, may be deposited on the external contact pads.

The semiconductor chips or at least parts of the semiconductor chips are covered with an encapsulating material to form an encapsulation (e.g., a molded body), which may be electrically insulating. The encapsulation may be a dielectric material and may be made of any appropriate duroplastic, thermoplastic or thermosetting material or laminate (prepreg). The encapsulant may contain filler materials. After its deposition, the encapsulant may be only partially hardened and may be completely hardened after application of energy (e.g. heat, UV light, etc.) to form an encapsulant. Various techniques may be employed to cover the semiconductor chips with the encapsulant, for example compression molding, injection molding, powder molding, liquid molding, dispensing or laminating.

The semiconductor chips may be provided with an electrical redistribution structure. The electrical redistribution structure may comprise one or more polymer layers. The polymer layer(s) may be applied during wafer level processing, that is during front-end processing. By way of example, the polymer layer(s) may be applied by a CVD (Chemical Vapor Deposition) process or by a spin coating process. The polymer layer(s) may be made of a photoresist or of any other etching resist. For example, a photoimide may be used. In particular, filler materials such as e.g. organic or mineral filler materials may be included in the polymer layer(s). The filler material may improve the CTE (coefficient of thermal expansion) to decrease stress and warpage of the package and may improve the protective effect of the polymer layer(s) to the semiconductor chip surface covered by the polymer layer(s).

The electrical redistribution structure may comprise one or more conductive layers, e.g., metal layers. The conductive layers may be used as wiring layers to make electrical contact with the semiconductor chips from outside the package and/or to make electrical contact with other semiconductor chips and/or components contained in the package. The conductive layers may be manufactured with any desired geometric shape and any desired material composition. The conductive layers may, for example, be composed of conductor tracks, but may also be in the form of a layer covering an area. They may be used to provide the external contact pads of the package. Any desired metal, for example aluminum, nickel, palladium, silver, tin, gold or copper, or metal alloys may be used as the material. The conductive layers can be homogenous or manufactured from just one material or they can be inhomogenous or manufactured from more than one material, that is to say various compositions and concentrations of the materials contained in the conductive layers are possible. Thin-film technologies may be applied to generate and/or structure the conductive layers.

Figure 1:
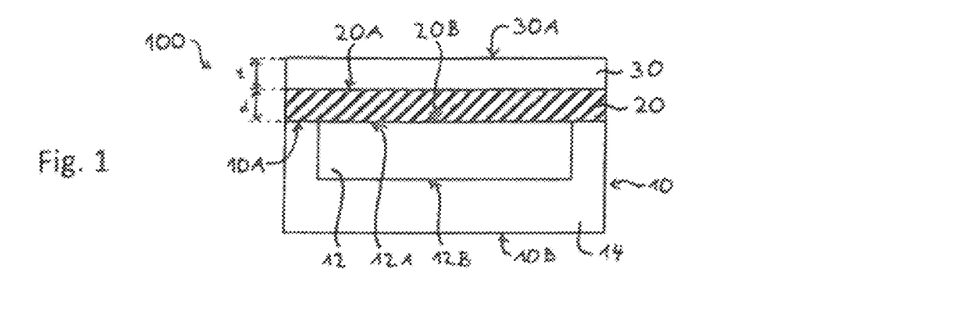
FIG. 1 shows a cross-sectional view of an embodiment of an electronic module.

FIG. 1 shows an electronic module 100 comprising a semiconductor package 10, a heat spreader 20 and an electrically insulating layer 30. The semiconductor package 10 may comprise a semiconductor chip 12 and an encapsulation body 14 at least partially encapsulating the semiconductor chip 12. According to an embodiment, the encapsulation body 14 encapsulates the semiconductor chip 12 on a second main face 12B and on four side faces connecting the second main face to a first main face 12A of the semiconductor chip 12, wherein the first main face 12A is not covered by the encapsulation body 14.

Electronic module 100 may be a Surface Mounted Device (SMD). A second main face 10B of semiconductor package 10 may be configured to be arranged on a further electronic member, for example a Printed Circuit Board (PCB). Semiconductor package 10 may be a leaded package or a leadless package.

The heat spreader 20 may be attached to a first main face 10A of the semiconductor package 10. The heat spreader 20 may be thermally coupled to the semiconductor chip 12. According to an embodiment, the heat spreader 20 may also be electrically coupled to the semiconductor chip 12. For example, the heat spreader may be electrically coupled to an electrode (not shown) arranged on the first main face 12A of semiconductor chip 12. The electrode may be an emitter electrode, a collector electrode, or a gate electrode in the case of the semiconductor chip 12 comprising an IGBT. The electrode may be a source electrode, drain electrode, or gate electrode in the case of the semiconductor chip 12 comprising a FET.

Figure 2:
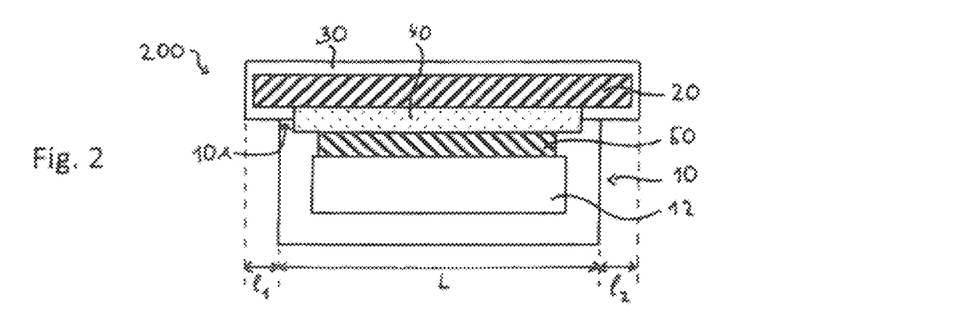
FIG. 2 shows a cross-sectional view of a further embodiment of an electronic module.

According to an embodiment, heat spreader 20 may completely cover the first main face 10A of semiconductor package 10. According to another embodiment, heat spreader 20 only partly covers first main face 10A of semiconductor package 10. Furthermore, heat spreader 20 may laterally project beyond a footprint of the semiconductor package 10 as shown in FIG. 2 with respect to electronic module 200. Heat spreader 20 may laterally project beyond only one side of semiconductor package 10, beyond two sides, for example two opposing sides, beyond three sides, or even beyond all (four) sides of semiconductor package 10. A surface area of a first main face 20A of heat spreader 20 may be larger than a surface area of first main face 10A of semiconductor package 10, for example about 1.5 times as large, about 2 times as large, about 3 times as large, or even more than 3 times as large. Heat spreader 20 may essentially be rectangular, heat spreader 20 may however also have any other suitable shape.

According to an embodiment, heat spreader 20 may comprise a metal sheet or a metal plate. Heat spreader 20 may have a thickness d of about or more than 0.1 mm, 0.2 mm, 0.5 mm, 0.7 mm and 1 mm. Heat spreader 20 may comprise one or more of copper and aluminum.

Insulating layer 30 may be arranged on first main face 20A of heat spreader 20. According to an embodiment, insulating layer 30 may further cover side faces of heat spreader 20, wherein the side faces reach from heat spreader first main face 20A to a heat spreader second main face 20B. According to yet another embodiment, insulating layer 30 may further at least partially cover heat spreader second main face 20B as for example shown in FIG. 2.

Insulating layer 30 may comprise any suitable dielectric organic or inorganic material. Insulating layer 30 may comprise an imide, for example a photoimide. Insulating layer 30 may comprise one or more of a mold material and a laminate. Insulating layer 30 may comprise epoxy. Insulating layer 30 may comprise filler material configured to improve a thermal conductivity of insulating layer 30. The filler material may for example comprise SiO. About 60%-70% of insulating layer 30 may be made up of filler material. Insulating layer 30 may have a thickness t of about or more than 0.01 mm, 0.05 mm, 0.1 mm, 0.3 mm and 0.5 mm.

Insulating layer 30 may be configured to electrically insulate heat spreader 20 against the outside world. For example, electronic module 100 may be a high voltage device meaning that semiconductor chip 12 may exhibit a drain-source voltage or collector-emitter voltage respectively of about 300V-400V. Heat spreader 20, being electrically connected to semiconductor chip 12, may exhibit the same voltage relative to ground potential. Insulating layer 30 may be configured to provide insulation against a voltage of that magnitude.

A layer of thermally conductive material may be arranged between semiconductor package 10 and heat spreader 20 (not shown in FIG. 1). In particular, the thermally conductive material may be arranged between semiconductor chip 12 and heat spreader 20. The thermally conductive material may comprise Thermal Interface Material (TIM) or thermal grease, silver paste, solder material, in particular diffusion solder material, or any other suitable material that exhibits sufficient thermal conductivity.

The thermally conductive material may be configured to attach heat spreader 20 to semiconductor package 10, for example via a solder joint or a glued joint. Alternatively or additionally, another means for attaching heat spreader 20 to semiconductor package 10 may be used, such as a screwing means or a clamping means.

Electronic module 100 may be configured to have a heat sink arranged on insulating layer first main face 30A. The heat sink may be configured to provide heat dissipation to semiconductor package 10 either by itself or additionally to a second heat sink, wherein the second heat sink may be arranged on a second side of a PCB opposite to a first side of the PCB to which electronic module 100 may be attached. That is, electronic module 100 may be designed to have two designated thermal pathways for dissipating heat, a first pathway to the heat sink arranged above insulating layer 30 and a second pathway to the second heat sink arranged below electronic module 100 on the opposite side of the PCB. Alternatively, electronic module 100 may be designed to have only one designated thermal pathway, namely to the heat sink arranged above insulating layer 30. Semiconductor package first main face 10A may be a top side of semiconductor package 10 and second main face 10B may be a bottom side of semiconductor package 10, wherein the bottom side may be configured for coupling the electronic module 100 to a PCB. Therefore, arranging heat spreader 20 (and possibly a heat sink attached to heat spreader 20) on the top side may be termed a "top-side-cooling" scheme of semiconductor package 10.

An effect of the heat spreader 20 may be to laterally spread out the heat generated by semiconductor package 10, for example heat generated by semiconductor chip 12. Laterally spreading out the heat by means of heat spreader 20 may improve a heat flow from semiconductor package 10 to a heat sink arranged above insulating layer 30.

An effect of insulating layer 30 may be to electrically insulate a heat sink arranged above insulating layer 30 from semiconductor package 10, in particular from semiconductor chip 12. Arranging insulating layer 30 above heat spreader 20 without electrically insulating heat spreader 20 from semiconductor package 10 may improve the heat flow into heat spreader 20 and may improve the lateral spreading out of the heat in the heat spreader 20.

FIG. 2 shows an electronic module 200, which may correspond to electronic module 100. The above disclosure related to electronic module 100 may also be applied to electronic module 200 and vice versa, and reiteration is avoided for the sake of brevity.

Electronic module 200 may comprise a layer of thermally conductive material 40 arranged between semiconductor chip 12 and heat spreader 20. The thermally conductive material 40 may furthermore be electrically conductive. Electronic module 200 may comprise a structural part 50 arranged between semiconductor chip 12 and heat spreader 20. Structural part 50 may in particular be arranged between semiconductor chip 12 and thermally conductive material 40. Structural part 50 may be one or more of electrically, thermally and mechanically coupled to semiconductor chip 12. Structural part 50 may in particular be coupled to an electrode of semiconductor chip 12. Structural part 50 may be one or more of electrically, thermally and mechanically coupled to heat spreader 20. Structural part 50 may comprise a metal, like for example copper or aluminum, or a metal alloy. Structural part 50 may comprise one or more of a chip carrier and a contact clip. Structural part 50 may comprise a leadframe.

Electronic module 200 may be configured such that insulating layer 30 is not arranged between heat spreader 20 and thermally conductive material 40. In other words, thermally conductive material 40 is in direct contact with heat spreader 20.

The layer of thermally conductive material 40 may be configured such that it either completely or only partially covers semiconductor package first main face 10A. Conductive material 40 may be electrically insulated from the outside world, for example by encapsulation body 14, by insulating layer 30, or by a combination thereof.

As shown in FIG. 2, heat spreader 20 may laterally project beyond a footprint of semiconductor package 10. Heat spreader 20 may laterally project beyond a first side of semiconductor package 10 by a length of $l_1$. Heat spreader 20 may laterally project beyond a second side of semiconductor package 10 by a length of $l_2$. Furthermore, heat spreader 20 may project beyond a third and a fourth side of semiconductor package 10 by a length of $l_3$ and $l_4$, respectively. The lengths $l_1$, $l_2$, $l_3$ and $l_4$ may be different from each other or they may be identical. The lengths $l_1$, $l_2$, $l_3$ and $l_4$ may each be about or more than 5%, 10%, 20%, 30%, 50%, 70% or 100% of a length L of the semiconductor package 10 long. The lengths $l_1$, $l_2$, $l_3$ and $l_4$ may each be about or more than 1 mm, 2 mm, 3 mm, 4 mm, 5 mm, 7 mm, or 10 mm long.

Figure 3:
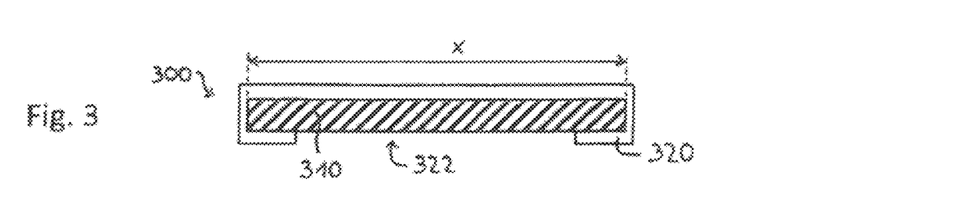
FIG. 3 shows a cross-sectional view of an embodiment of a heat spreader.

FIG. 3 shows a heat spreading array 300 comprising a heat spreader 310 and an electrically insulating layer 320. Heat spreader 310 may correspond to heat spreader 20 and insulating layer 320 may correspond to insulating layer 30. Heat spreader 310 may have a basically quadratic or rectangular shape. An edge length x of heat spreader 310 may be about or more than 3 mm, 5 mm, 8 mm, 10 mm, 15 mm, 30 mm, or 50 mm long.

According to an embodiment, fabrication of heat spreader 310 may comprise one or more of stamping, cutting and sawing a metal plate or metal sheet. According to an embodiment, insulating layer 320 may be applied to heat spreader 310 using techniques like CVD, spin coating, or any other suitable surface treatment techniques. Application of insulating layer 320 onto heat spreader 310 may be performed selectively, that is, insulating layer 320 is not be applied to at least a part of a second main face of heat spreader 310, forming an opening 322. Alternatively, insulating layer 320 may be applied such that heat spreader 310 is completely covered by insulating layer 320 and opening 322 is formed afterwards by selectively removing insulating layer 320.

Heat spreading array 300 may or may not be dimensionally stable when not being attached to one or more of a semiconductor package and a heat sink.

Figure 4:
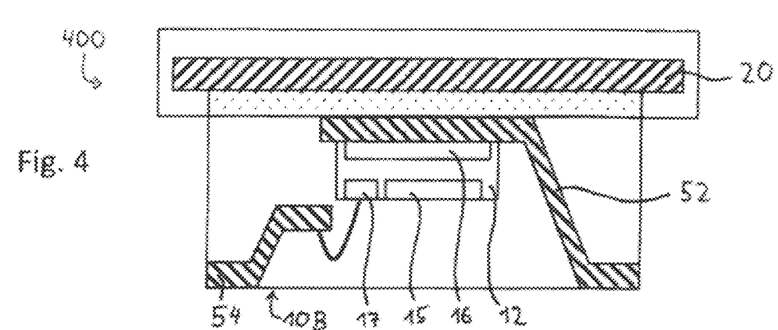
FIG. 4 shows a cross-sectional view of a further embodiment of an electronic module.

FIG. 4 shows a further embodiment of an electronic module 400, wherein electronic module 400 may correspond to electronic modules 100 and 200. The above disclosure related to electronic modules 100 and 200 may also be applied to electronic module 400 and vice versa, and reiteration is avoided for the sake of brevity.

In electronic module 400, semiconductor chip 12 is arranged in "source-down" configuration, wherein a source contact 15 faces semiconductor package second main face 10B. Semiconductor chip 12 is attached to a chip carrier 52 such that drain electrode 16 is electrically coupled to the chip carrier 52 and faces heat spreader 20. Chip carrier 52 may correspond to structural part 50 of FIG. 2. Chip carrier 52 may comprise an outer contact element exposed on semiconductor package second main face 10B. A gate electrode 17 may be arranged next to the source electrode 15 and may be electrically coupled to an outer contact element 54. Source electrode 15 may also be electrically coupled to an outer contact element which is not shown in FIG. 4 for the sake of simplicity.

According to an embodiment, semiconductor chip 12 of electronic module 400 is an IGBT chip and electrodes 15 and 16 are an emitter electrode and a collector electrode, respectively.

Figure 5:
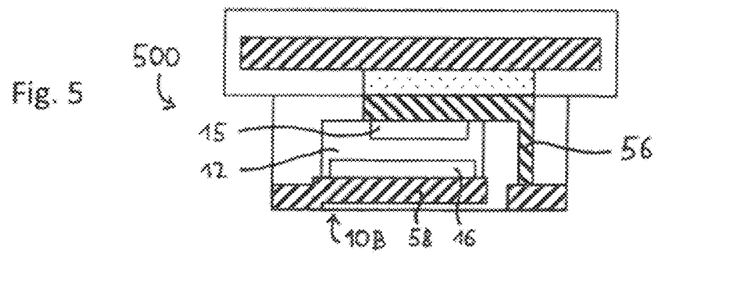
FIG. 5 shows a cross-sectional view of a further embodiment of an electronic module.

FIG. 5 shows a further embodiment of an electronic module 500, wherein electronic module 500 may correspond to electronic modules 100 and 200. The above disclosure related to electronic modules 100 and 200 may also be applied to electronic module 500 and vice versa, and reiteration is avoided for the sake of brevity.

Electronic module 500 comprises a contact clip 56, wherein contact clip 56 may correspond to structural part 50 of FIG. 2. Contact clip 56 may be coupled to electrode 15 of semiconductor chip 12, wherein electrode 15 may be a source electrode or a emitter electrode, respectively. Contact clip 56 may further be coupled to an outer contact element arranged on semiconductor package second main face 10B. Semiconductor chip 10 of electronic module 500 is arranged on a chip carrier 58 such that an electrode 16 is coupled to chip carrier 58, wherein electrode 16 is a drain electrode or a collector electrode, respectively. Chip carrier 58 comprises an outer contact element arranged on semiconductor package second main face 10B. Semiconductor chip 12 may further comprise a gate electrode (not shown in FIG. 5) arranged side by side with electrode 15 and electrically coupled to a further outer contact element (also not shown in FIG. 5).

Figure 6A:
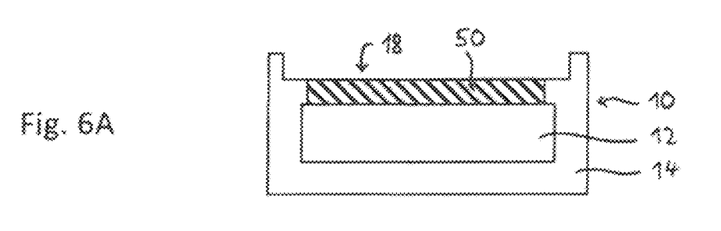
FIGS. 6A-6C show cross-sectional views of an electronic module in various stages of fabrication according to an embodiment of a method of fabricating an electronic module.
Figure 6B:
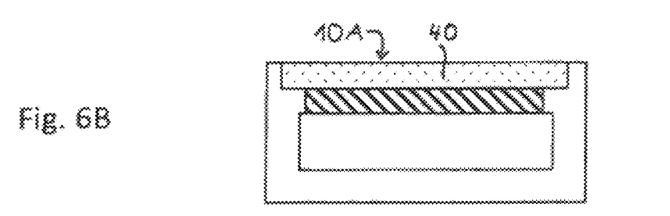
Figure 6C:
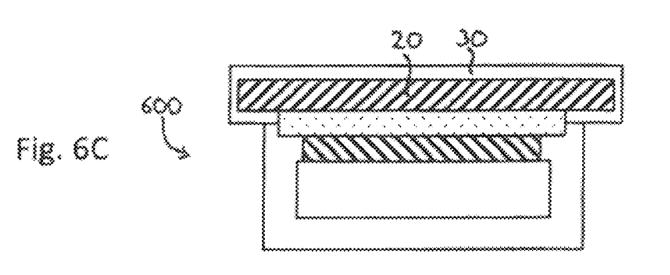

FIGS. 6A-6C show an electronic module 600 in various stages of fabrication according to an embodiment of a method of fabricating an electronic module. Electronic module 600 may correspond to electronic modules 100, 200, 400, or 500. The above disclosure related to electronic modules 100, 200, 400, or 500 may also be applied to electronic module 600 and vice versa, and reiteration is avoided for the sake of brevity.

FIG. 6A shows a semiconductor package 10, wherein semiconductor package 10 may comprise a bearing area 18 configured for bearing a layer of thermally conductive material. Bearing area 18 may comprise a recess integrated into encapsulation body 14. However, the first main face of semiconductor package 10 may also be flat without a recess, wherein bearing area 18 is simply a part of the flat first main face. Bearing area 18 may cover only a part of the first main face of semiconductor package 10, or it may cover the whole of the first main face. Structural part 50 may be exposed at bearing area 18.

FIG. 6B shows a layer of thermally conductive material 40 arranged on bearing area 18. Thermally conductive material 40 may be coplanar with semiconductor package first main face 10A, however it may also be arranged on top of semiconductor package first main face 10A.

FIG. 6C shows electronic module 600, wherein heat spreader 20 is attached to semiconductor package 10. Furthermore, the insulating layer 30 on top of heat spreader 20 is shown. Insulating layer 30 may be applied to heat spreader 20 before attaching the heat spreader 20 to semiconductor package 10, or alternatively after attachment. An interface between semiconductor package first main face 10A and heat spreader 20 may at least partially comprise insulating layer 30 as shown in FIG. 6C. Alternatively, the interface may be free of insulating layer 30.

Figure 6D:
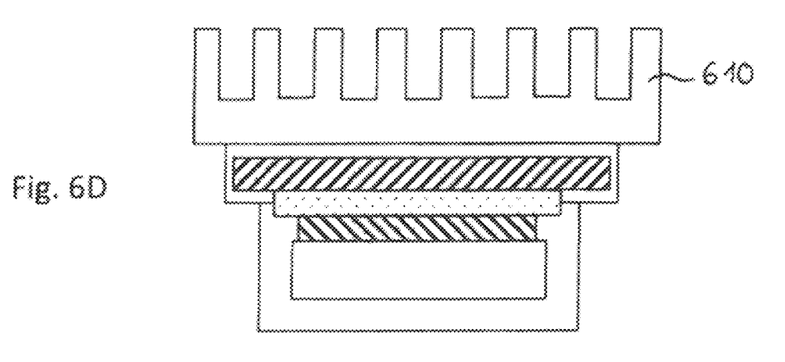
FIG. 6D shows a cross sectional view of an electronic module with an attached heat sink.

FIG. 6D shows a heat sink 610 arranged on top of electronic module 600. A second layer of thermally conductive material may be arranged between heat sink 610 and insulating layer 30 (not shown in FIG. 6D). The second layer of thermally conductive material may comprise the same material or material composition as the layer of thermally conductive material 40 and reiteration is avoided. Heat sink 610 may for example be attached to electronic module 600 by one or more of a solder joint, a glue joint, a clamping means and a screwing means.

Heat sink 610 may laterally project beyond heat spreader 20, for example by about or more than 1 mm, 2 mm, 5 mm, 10 mm, or 20 mm. Heat sink 610 may for example have an essentially rectangular or quadratic footprint.

Figure 7A:
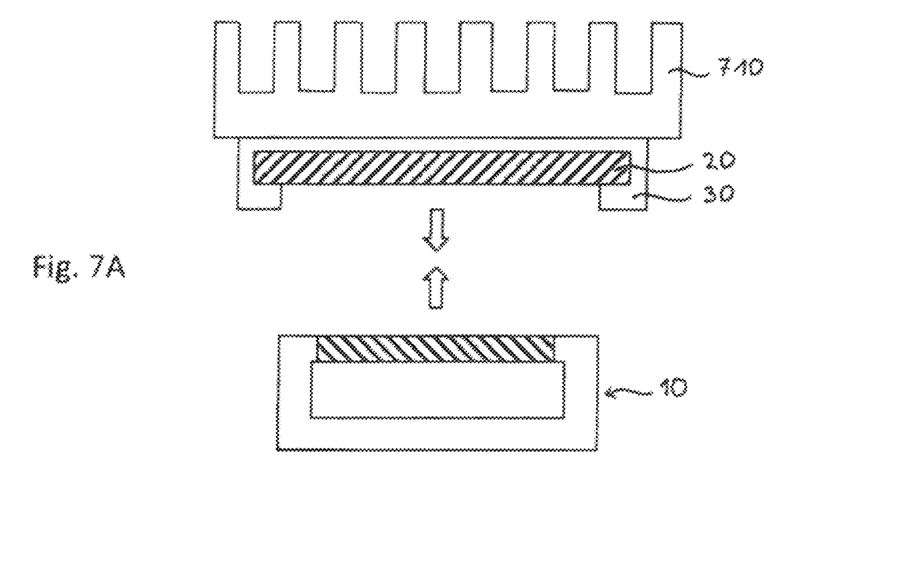
FIGS. 7A and 7B show cross-sectional views of an electronic module in various stages of fabrication according to a further embodiment of a method of fabricating an electronic module.
Figure 7B:
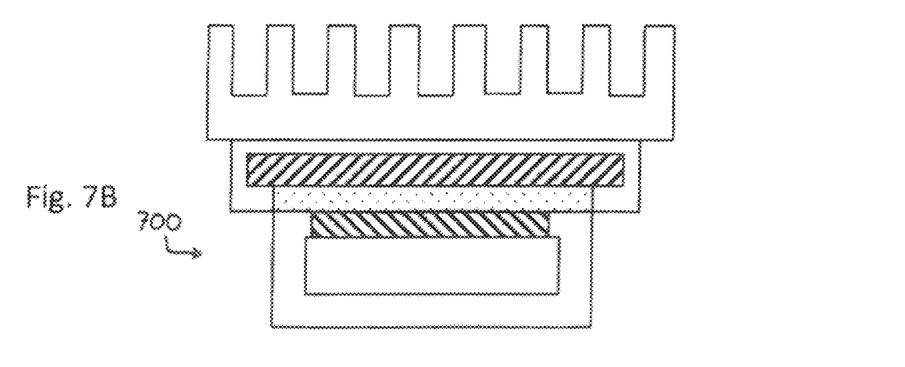

FIGS. 7A and 7B show stages of fabrication of an electronic module 700 fabricated according to a further embodiment of a method of fabricating an electronic module. According to this embodiment, a heat spreader is attached to a heat sink prior to attaching the heat spreader to a semiconductor package. Electronic module 700 may correspond to electronic modules 100, 200, 400, or 500. The above disclosure related to electronic modules 100, 200, 400, or 500 may also be applied to electronic module 700 and vice versa, and reiteration is avoided for the sake of brevity.

FIG. 7A shows a semiconductor package 10 and a heat spreader 20 attached to a heat sink 710. Insulating layer 30 is arranged between heat sink 710 and heat spreader 20 and electrically insulates the heat spreader 20 from the heat sink 710. A second layer of thermally conductive material as described above may be arranged between insulating layer 30 and heat sink 710 (not shown).

FIG. 7B shows electronic module 700 after attaching the combined arrangement of heat spreader 20 and heat sink 710 to semiconductor package 10.

Figure 8:
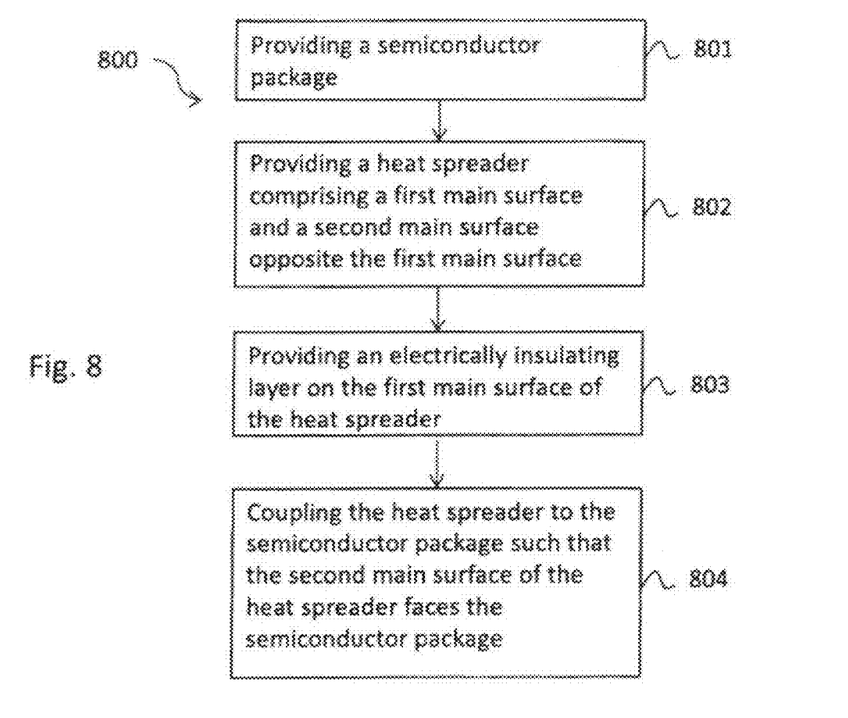
FIG. 8 shows a flow-chart of an embodiment of a method of fabricating an electronic module.

FIG. 8 shows a flow chart of an embodiment of a method of fabricating an electronic module 800. Note that method steps of method 800 need not necessarily be performed in the depicted order. A first method step 801 of method 800 may comprise providing a semiconductor package. A second method step 802 may comprise providing a heat spreader comprising a first main surface and a second main surface opposite the first main surface. A third method step 803 may comprise providing an electrically insulating layer on the first main surface of the heat spreader. A fourth method step 804 may comprise coupling the heat spreader to the semiconductor package such that the second main surface of the heat spreader faces the semiconductor package.

Figure 9A:
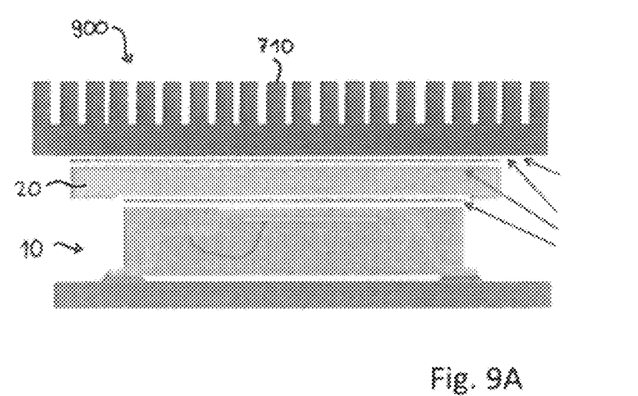
FIGS. 9A and 9B show cross-sectional views of an electronic module comprising a heat spreader (FIG. 9A) and an electronic module without a heat spreader (FIG. 9B), as well as simulation results of a thermal resistance in the electronic modules.
Figure 9B:
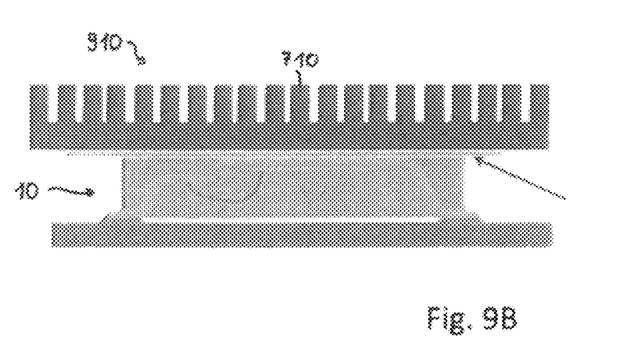

FIGS. 9A and 9B show simulation results of the top-side-cooling thermal resistance $R_{th}$ of an electronic module 900 comprising a heat spreader 20 (FIG. 9A) and of an electronic module 910 without a heat spreader (FIG. 9B). A heat sink 710 is arranged above each of the electronic modules 900 and 910. The electronic module 900 may correspond to electronic modules 100, 200, 400, 500, 600 and 700. The values in brackets denote the thickness of the respective layer in the simulation. The simulation results shows that a heat spreader 20 may significantly reduce $R_{th}$.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic module, comprising:
    a semiconductor package comprising a semiconductor chip and an electrically insulating encapsulation body encapsulating the semiconductor chip, the encapsulation body completely covering a second main face and four side faces of the semiconductor chip, wherein a first main face of the semiconductor chip that is opposite the second main face is exposed from the encapsulation body;
    a heat spreader attached to the semiconductor package, the heat spreader completely covering the first main face of the semiconductor chip; and
    an electrically insulating layer disposed on the heat spreader remote from the semiconductor package, wherein the electrically insulating layer is completely separated from the semiconductor chip.

2. The electronic module of claim 1, wherein the electronic module is a Surface Mounted Device (SMD).

3. The electronic module of claim 1, wherein a second main face of the semiconductor package comprises electrical contact elements for electrically contacting a semiconductor chip of the semiconductor package from outside of the semiconductor package, and wherein the heat spreader is arranged on a first main face of the semiconductor package, the first main face being opposite the second main face.

4. The electronic module of claim 1, wherein the heat spreader is electrically coupled to the semiconductor chip of the semiconductor package.

5. The electronic module of claim 1, wherein the semiconductor chip is a semiconductor power chip.

6. The electronic module of claim 1, wherein a thermal interface material is arranged between the semiconductor chip of the semiconductor package and the heat spreader, and wherein the thermal interface material comprises one or more of a solder, a thermal grease, a silver paste and a conductive adhesive.

7. The electronic module of claim 1, wherein the electrically insulating layer electrically insulates the heat spreader against the outside world.

8. The electronic module of claim 1, wherein the heat spreader laterally projects beyond a footprint of the semiconductor package.

9. The electronic module of claim 1, further comprising a heat sink arranged on a first main surface of the heat spreader and electrically insulated from the heat spreader by the electrically insulating layer.

10. The electronic module of claim 1, wherein the heat spreader comprises one or more of copper and aluminum.

11. The electronic module of claim 5, wherein a drain contact or a collector contact of the semiconductor power chip faces the heat spreader.

12. The electronic module of claim 5, wherein a source contact or an emitter contact of the semiconductor power chip faces the heat spreader.

13. The electronic module of claim 6, wherein a chip carrier or a contact clip is arranged between the semiconductor chip and the thermal interface material.

14. A heat spreader, comprising:
a metal sheet or metal plate,
an electrically insulating layer arranged over the metal sheet or metal plate,
wherein the metal sheet or metal plate has a thickness in the range of 0.1 mm-1 mm, and
wherein the electrically insulating layer completely covers a first main face and each side face of the metal plate, and
wherein the electrically insulating layer partially covers and partially exposes a second main face of the metal plate, the second main face being opposite from the first main face.

15. The heat spreader of claim 14, wherein the electrically insulating layer comprises one or more of an imide, a mold material, and a laminate.

* * * * *